United States Patent [19]

Lüthje et al.

[11] Patent Number: 4,606,803
[45] Date of Patent: Aug. 19, 1986

[54] METHOD OF MANUFACTURING A MASK FOR THE PRODUCTION OF PATTERNS IN LACQUER LAYERS BY MEANS OF X-RAY LITHOGRAPHY

[75] Inventors: Holger K. Lüthje, Halstenbek; Angelika M. Brüns, Henstedt-Ulzburg; Margret Harms, Hamburg; Bernd R. G. Matthiessen, Seevetal, all of Fed. Rep. of Germany

[73] Assignee: U.S. Philips Corporation, New York, N.Y.

[21] Appl. No.: 665,278

[22] Filed: Oct. 26, 1984

[30] Foreign Application Priority Data

Nov. 2, 1983 [DE] Fed. Rep. of Germany ....... 3339624

[51] Int. Cl.⁴ ............................................. C23C 15/00
[52] U.S. Cl. .............................. 204/192 P; 204/192 C; 430/5; 378/35; 156/645
[58] Field of Search .......... 204/192 P, 192 SP, 192 C; 430/5, 324, 323, 966; 378/34, 35; 156/643, 644, 645

[56] References Cited

U.S. PATENT DOCUMENTS

| 4,198,263 | 4/1980 | Matsuda | 430/5 X |
| 4,384,919 | 5/1983 | Casey | 430/5 X |

FOREIGN PATENT DOCUMENTS

| 3232499 | 3/1984 | Fed. Rep. of Germany | 430/5 |
| 0088331 | 7/1980 | Japan | 430/5 |
| 0112728 | 9/1981 | Japan | 430/5 |
| 0132343 | 10/1981 | Japan | 430/5 |
| 0208138 | 12/1982 | Japan | 430/5 |
| 0071622 | 4/1983 | Japan | 430/5 |
| 0215028 | 12/1983 | Japan | 430/5 |
| 0034632 | 2/1984 | Japan | 430/5 |

*Primary Examiner*—John F. Niebling
*Assistant Examiner*—Nam X. Nguyen
*Attorney, Agent, or Firm*—Robert T. Mayer

[57] ABSTRACT

A method of manufacturing a mask for producing patterns in lacquer layers by means of X-ray lithography comprising a diaphragm which is very transparent to the X-ray radiation, is stretched on a frame in a self-supporting manner and which is applied as a thin layer to a substrate in a manner such that it is subjected to tensile stress, while the substrate is then removed as far as a part constituting a frame for the then self-supporting diaphragm.

9 Claims, 7 Drawing Figures

METHOD OF MANUFACTURING A MASK FOR THE PRODUCTION OF PATTERNS IN LACQUER LAYERS BY MEANS OF X-RAY LITHOGRAPHY

The invention relates to a method of maufacturing a mask for the production of patterns in lacquer layers by means of X-ray lithography. It comprises a diaphragm, which is very transparent to X-ray radiation, and which is stretched in a self-supporting manner on a frame. On one major surface it has a pattern for absorbing X-ray radiation.

Especially in the manufacture of integrated semiconductor systems, but also, for example, in the manufacture of magnetic cylindrical bubble arrangements, there is a steady demand for increasingly smaller details and the resolution, which is desired nowadays in the structure and in the mask, approaches the limit set by the wavelength of light. Therefore, methods other than photo-optical methods are already used to permit obtaining the transition to a higher resolution.

With a view to the manufacture of miniature patterns in the micron and submicron range, X-ray lithography is of major interest. In X-ray lithography, a 1:1 projection method is concerned. Therefore, the accuracy of the circuit patterns to be produced, for example, on a semiconductor substrate is mainly defined by the X-ray mask. Since X-ray radiation is comparatively strongly absorbed in the substance, the masks have to be composed of thin diaphragms with absorber, structures provided thereon with great accuracy.

For the absorber, materials having a highest possible atomic weight have to be used; for example, gold, molybdenum and tungsten have proved to be very suitable in practice.

As a material for the diaphragm practically all materials can be used which are sufficiently transparent to X-ray radiation. Since, however, in the X-ray radiation range, no material is completely transparent and no material is completely opaque, the diaphragm should be comparatively thin in order to guarantee a highest possible transparence to X-rays; on the contrary, the absorber pattern should be comparatively thick in order to ensure a highest possible absorption of X-rays. In practice, inter-alia diaphragms of silicon, of titanium and of magnesium are known.

German Patent Application No. P 32 32 499.5 discloses the manufacture of a mask for X-ray lithography. The manufacturing method described in this pre-publication operates with several discrete processing steps for a stripping and stretching process, in which a diaphragm formed on a substrate is mechanically stripped off the substrate and is stretched in further processing steps onto a particular frame and is connected to it by gluing. This method has proved to be suitable in practice, but is not sufficiently effective for mass production processes because it is complicated and hence expensive due to the large number of separate processing steps and because in a discrete manner of manufacturing, as is only possible according to the known method, only a low yield can be expected.

The invention has for its object to improve a method of the kind mentioned in the opening paragraph in a manner such that it can be used economically also for a manufacture in mass production while saving several processing steps.

According to the invention, this object is achieved in that the diapragm is applied to a substrate as a thin layer of an inorganic material by means of cathode sputtering, the parameters of the cathode sputtering process being chosen so that the diaphragm is subjected to tensile stress and in that the substrate is subsequently removed except for a part constituting a frame for the then self-supporting diaphragm.

According to an advantageous embodiment of the invention, the material used for the diaphragm is magnesium. Magnesium has particular advantages as a material for X-ray lithography masks because it has an extremely high transparence to X-ray radiation, especially in the range of from 1 to 4 nm. Due to the lacquer sensitivity increasing with increasing wavelength on the one hand and due to the just compatible diffraction phenomena on the other hand, especially this wavelength range is of particular interest for X-ray lithography. For an X-ray exposure apparatus operating with a copper target, a magnesium diaphragm is particularly suitable. In such apparatus, CuK$\alpha$ radiation having a wavelength $\lambda = 1.34$ nm is produced. A mask having a magnesium diaphragm would also be very suitable, however, for exposure apparatus operating with synchrotron radiation.

According to a further advantageous embodiment of the invention, auxiliary layers of an organic material as transparent as possible to X-ray radiation are provided on the substrate before deposition of the diaphragm and on the diaphragm. A polyimide is used for the auxiliary layers. Thus, the advantage is obtained that the diaphragm is protected so that further processing steps, for example a galvanic process for applying the absorber structure, can be carried out without the diaphragm being jeopardized.

A further advantage is that the auxiliary layers can be maintained as a part of the mask because polyimide is very transparent to X-ray radiation. Negative properties both of the magnesium and of the polyimide for mask application are compensated for by the composite diaphragm thus constructed since magnesium tends to chemical surface changes; and since synthetic material, including polyimide, have, depending upon the environmental influences, a strongly fluctuating accuracy to size and they further age strongly under the influence of X-rays. These disadvantages are mutually eliminated by the combination of an inorganic material and organic materials for the diaphragm.

Due to the construction of such a composite diaphragm, comparatively large diaphragms can be manufactued, which nevertheless operate with a great accuracy to size, even under unfavourable environmental conditions, and which are comparatively insensitive to mechanical and chemical attacks.

The manufacture of the diaphragm by means of cathode sputtering has the advantage that the process parameters can be adjusted so that the layer is subjected to tensile stress so that later, when a part of the substrate has been removed and a self-supporting diaphragm is obtained, length variations due to thermal influences are compensated for. The mechanical stress of a layer applied by cathode sputtering can be influenced by the power, a bias voltage applied to the substrate and the gas pressure in the sputtering space. According to advantageous further embodiments of the invention, the cathode sputtering process is carried out at a power in the range of from 0.4 to 1.2 W/cm$^2$ and a gas pressure in the range of from 10 to 40 $\mu$bar, 0 to 20% of the power required for the cathode sputtering process being preferably supplied to the plasma via the substrate electrode in the form of a bias voltage applied to the substrate electrode.

According to a further favourable embodiment of the invention, the diaphragm for obtaining adjustment areas transparent to radiation from the visible part of the spectrum is applied to the substrate through a covering mask. Since suitable diaphragm materials are frequently opaque to the visible part of the spectrum, the fully automatic alignment of the mask and the substrate to be exposed through it can therefore not be effected without further expedients by means of the laser adjustment which is very advantageous for these processes. Attempts have already been made to provide in diaphragms adjustment windows of materials transparent to visible light; however, this requires a large number of processing steps, which can be avoided in a suitable manner with the use of the present method.

Besides the aforementioned advantages, the invention has the further advantages that a very satisfactorily operating mask carrier for an X-ray lithograhy mask can be manufactured in a surprisingly simple manner, whose diaphragm can be formed without manual processing steps, such as detaching from a substrate, stretching and gluing onto a separate frame, directly on a substrate with an adjustable desired mechanical pre-stress, while furthermore a separate no longer frame need be manufactured because the required frame can be formed directly from the substrate with the process of manufacturing the diaphragm further permitting the simultaneous formation of adjustment windows. It is surprising in the method according to the present invention, which is therefore also very suitable for mass production in economical respect, that the comparatively thick substrate can be readily removed in the part, in which the diaphragm should later be self-supporting, without adversely affecting the stress conditions formed initially in the diahragm.

an embodiment of the invention will be described and its operation will be explained with reference to the drawing. In the drawing.

Figure 1:
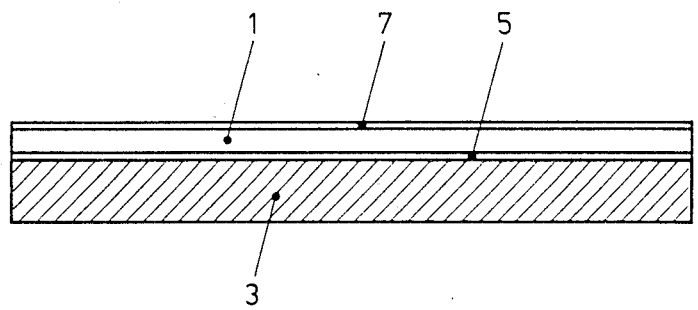
FIG. 1 shows in sectional view a substrate with a multilayer diaphragm.

FIG. 1 shows in sectional view a diaphragm 1 according to the invention on a substrate 3, auxiliary layers 5 and 7 being provided between the substrate 3 and the diaphragm 1 and above the diaphragm 1.

In the present example, the manufacture of a magnesium diaphragm on a glass substrate is described, the magnesium diaphragm being protected by auxiliarly layers of polyimide.

The substrate 3 is a commercially available glass plate having, for example, four inch standard dimensions coated on one side with a sandwich structure consisting of two auxiliary layers 5,7 of polyimide, each having a thickness of 0.5 $\mu$m, and of an interposed diaphragm 1 in the form of a 2 $\mu$m thick magnesium layer. For the manufacture of the polymide layer 5 use may be made of a commercially available lacquer, which is applied by centrifuging and is subjected to a subsequent imidization process. Favourable results are obtained with the following temperature treatment, preferably in $N_2$ atmosphere: annealing for one hour at 100° C., annealing for one hour at 180° C. and annealing for one hour at 350° C. Subsequently, the diaphragm 1 in the form of a magnesium layer is applied by means of cathode sputtering. It is then of major importance that the layer is produced with a tensile stress so that thermal length variations can be compensated for. The desired tensile stress can be adjusted by the use of given cathode sputtering parameters. As is shown in FIGS. 3a and 3b, the mechanical stress $P_Z$, $P_D$ in magnesium layers can be influenced by the power $\phi$, the substrate bias voltage Vs and the gas pressure $P_{Ar}$ in the sputtering space.

Figure 3A:
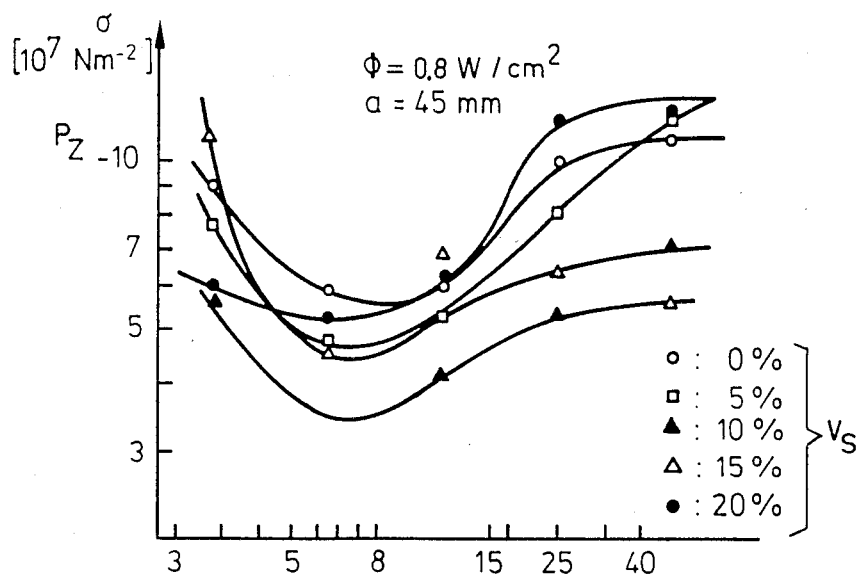
FIGS. 3a, 3b are graphs of the stress produced through various process parameters in a magnesium layer applied to a substrate by cathode sputtering.

In FIG. 3a, the tensile stress $P_Z$ produced in a magnesium layer at a power of 0.8 W/cm² and a electrode distance a=45 mm is plotted against the argon pressure $P_{Ar}$ in the sputtering chamber at various bias voltages at the substrate.

Figure 3B:
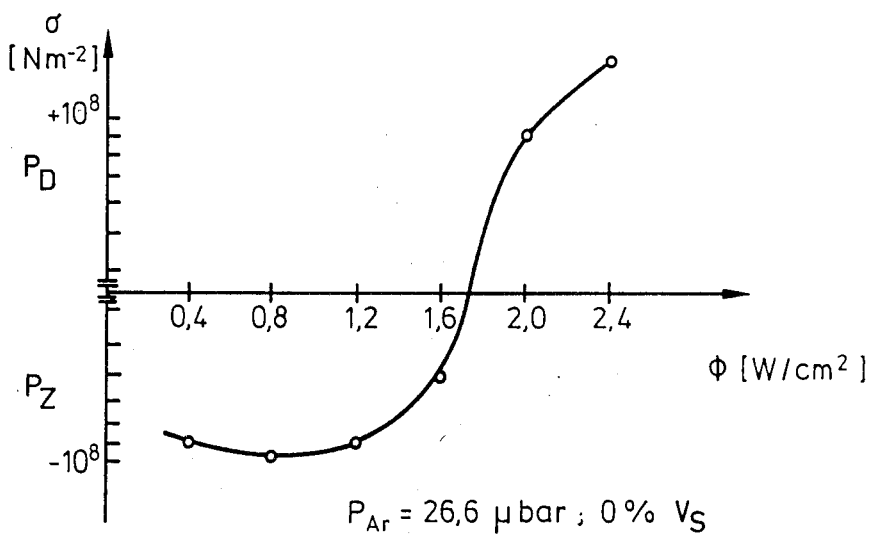

In FIG. 3b, the stress produced B,$P_z$ (tensile stress $P_Z$, compression stress $P_D$) in a magnesium layer at an argon pressure of 26.6 $\mu$bar and 0% bias voltage at the substrate is plotted against the power $\phi$.

Optimum conditions for the embodiment described here could be obtained at a power of 0.4 W/cm², an argon pressure of 20 $\mu$bar and 0 % bias voltage at the substrate.

Figure 2A:
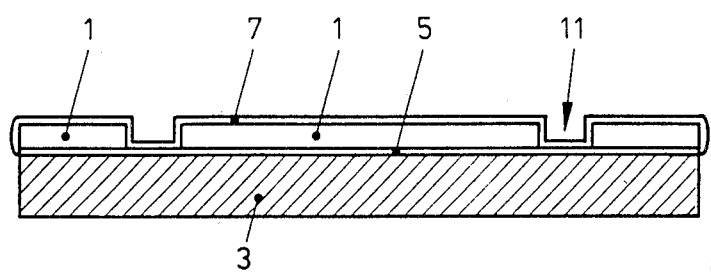
FIGS. 2a, 2b show in sectional view (FIG. 2a) and in plan view (FIG. 2b) a diaphragm with adjustment windows.
Figure 2B:
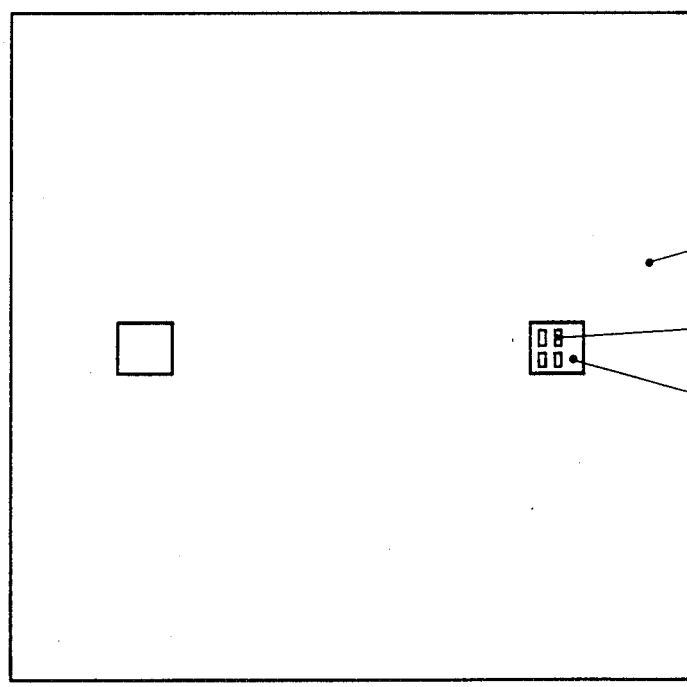

A great advantage of the present method is that for obtaining optically transparent adjustment areas 11 a simple mechanical covering mask can be used during the process of applying the diaphragm 1 by sputtering (cf. FIGS. 2a, 2b). Adjustment figures produced in later processing steps by means of electron beam lithography can be carried by the transparent auxiliary layers 5,7 of polyimide.

Figure 4A:
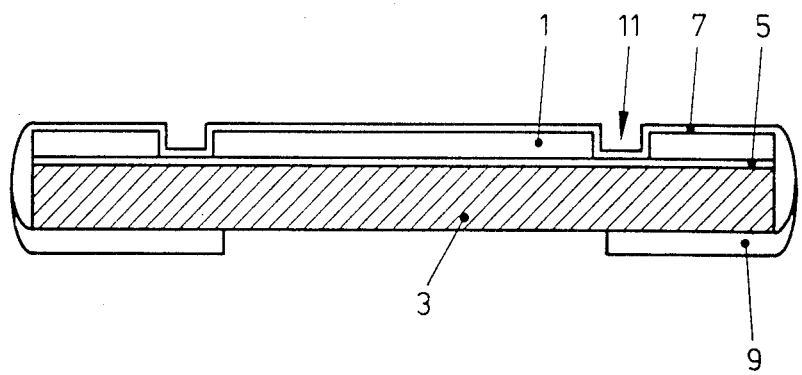
FIGS. 4a, 4b show in sectional view a multilayer diaphragm and a representation of process parameters for partly removing the substrate.
Figure 4B:
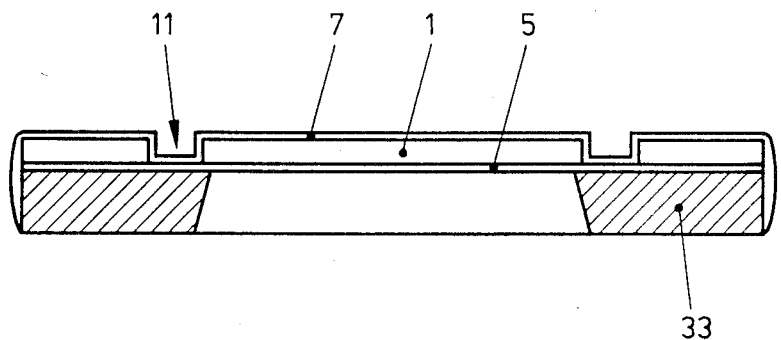

For forming a multilayer diaphragm, the auxiliary layer 7 of polyimide is subsequently applied to the diaphragm 1. This layer is also applied by centrifuging. The annealing treatment for this auxiliary layer is advantageously effected at a temperature of 150° C. for a duration of four hours. The surface of the multilayer diaphragm can be defined in a reproducible manner by means of a mask produced photolithographically or by means of a mechanical encapsulation and an etching process. If use is made of a photolithographically produced mask, the back side of the glass substrate 3 is coated with 2 $\mu$m thick photolaquer layer 9 (FIG. 4a) and is annealed for one hour at 90° C. In accordance with the desired surface and form of the diaphragm, this photolaquer layer is exposed through a mask and developed. By means of a wet-chemical etching process, the substrate 3 of glass is removed at the area not coated with photolaquer 9, while the process of etching the auxiliary layer 5 of polyimide is stopped. The etchant used may be a mixture of hydrofluoride HF and $H_2O$.

Instead of a wet-chemical etching process, a plasma-etching process or the combination of a wet-chemical etching process with a dry-etching process may also be used successfully. If the composite body of the substrate 3, the diaphragm 1 and the auxiliary layers 5,7 is etched while using a mechanical encapsulation, the size of the self-supporting diaphragm surface can be defined through a window in the encapsulation whose size correspondends to that of the desired diaphragm surface.

The substrate 3 is shown as a monolithic body in FIGS. 1, 2a, 4a and 4b, from which the part not constituting the frame 33 is removed by etching. The following procedure may also be used advantageously:

the frame having an opening corresponding to the size of the selfsupporting diaphragm is rigidly connected on one side, for example by gluing, to a continuous, but thinner substrate so that during the subsequent etching process only a substrate part of small thickness at the area of the opening of the frame need be etched, as a result of which nevertheless a stable frame of large thickness is obtained.

The mask carrier thus obtained (FIG. 4b) with a diaphragm 1 and two auxiliary layers 5,7 on a frame 33 etched out of the substrate 3 is then provided in known manner with the desired absorber patterns, and the thin auxiliary layers 5,7 of polyimide left on the diaphragm 1 permit the advantageous manufacture of galvanically reinforced absorber structures.

An advantageous embodiment of a mask adjustable with light is obtained if for example in the manufacture of semiconductor elements as, adjustment figures required for a first mask step (cf. FIG. 2b) adjustment figures (15) are formed by means of electron beam lithography on the substrate 3 within the adjustment windows 11, while as figures for a further mask step, adjustment figures may be used which are produced additionally on the diaphragm 1 outside of the area of the frame. Thus, alternating figures for a step and repeat mode are obtained. The periodicity is then determined by the step and repeat field area to be imaged.

What is claimed is:

1. A method of manufacturing a mask for producing patterns in lacquer layers by X-ray lithography comprising the steps of
    stretching a diaphragm transparent to X-ray radiation on a frame for forming a self-supporting diaphragm,
    providing a pattern for absorbing said X-ray radiation on one major surface of said diaphragm
    wherein the improvement comprises the steps of
    applying a thin layer of an inorganic material onto a substrate by cathode sputtering to form said diaphragm,
    choosing parameters of said cathode sputtering to form a tensile stress in said diaphragm, and
    removing a part of said substrate to form said frame of the self-supporting diaphragm.

2. A method as claimed in claim 1, characterized in that the cathode sputtering process is carried out at a power in the range of from 0.4 to 1.2 $W/cm^2$ and at a gas pressure in the range of from 10 to 40 $\mu$bar.

3. A method as claimed in claim 2, characterized in that 0 to 20% of the power required for the cathode-sputtering process is supplied to the plasma in the form of a bias voltage applied to the substrate.

4. A method as claimed in claim 1, characterized in that the inorganic material used for the diaphragm (1) is magnesium.

5. A method as claimed in claim 1, characterized in that auxiliary layers (5,7) of an organic material substantially transparent to the X-ray radiation are applied to the substrate (3) before deposition of the diaphragm (1) and to the diaphragm.

6. A method as claimed in claim 5, characterized in that the organic material used for the auxiliary layers (5,7) is a polyimide.

7. A method as claimed in claim 1, characterized in that the diaphragm (1) is applied for obtaining adjustment areas (11) transparent to radiation from the visible part of the spectrum through a covering mask covering the adjustment areas to the substrate (3).

8. A method as claimed in claim 1, characterized in that the substrate (3) is glass.

9. A method as claimed in claim 8, characterized in that a part of the substrate (3) not constituting the frame (33) is removed by a wet-chemical etching process.

* * * * *